United States Patent
Ku et al.

(10) Patent No.: US 7,465,617 B2
(45) Date of Patent: Dec. 16, 2008

(54) METHOD OF FABRICATING A SEMICONDUCTOR DEVICE HAVING A SILICON OXIDE LAYER, A METHOD OF FABRICATING A SEMICONDUCTOR DEVICE HAVING DUAL SPACERS, A METHOD OF FORMING A SILICON OXIDE LAYER ON A SUBSTRATE, AND A METHOD OF FORMING DUAL SPACERS ON A CONDUCTIVE MATERIAL LAYER

(75) Inventors: Ja-Hum Ku, Seongnam (KR); Chang-Won Lee, Seoul (KR); Seong-Jun Heo, Seoul (KR); Min-Chul Sun, Busan Metropolitan (KR); Sun-Pil Youn, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 234 days.

(21) Appl. No.: 11/269,599

(22) Filed: Nov. 9, 2005

(65) Prior Publication Data

US 2006/0057807 A1   Mar. 16, 2006

Related U.S. Application Data

(63) Continuation of application No. 10/612,041, filed on Jul. 3, 2003, now Pat. No. 7,005,367.

(30) Foreign Application Priority Data

Jul. 9, 2002   (KR) .............................. 2002-39834

(51) Int. Cl.
    *H01L 21/336* (2006.01)
(52) U.S. Cl. ....................... 438/197; 438/230
(58) Field of Classification Search ............... 438/197, 438/230
    See application file for complete search history.

(56) References Cited

U.S. PATENT DOCUMENTS

| 6,077,791 | A | 6/2000 | DeTar |
| 6,218,314 | B1 | 4/2001 | Lin |
| 7,005,367 | B2 * | 2/2006 | Ku et al. ..................... 438/595 |
| 7,247,920 | B2 * | 7/2007 | Weimer ..................... 257/411 |
| 2002/0127763 | A1 * | 9/2002 | Arafa et al. .................. 438/76 |

FOREIGN PATENT DOCUMENTS

KR   2000-40109   7/2000

OTHER PUBLICATIONS

S.C. Song et al., "Ultra Thin high quality stack nitride/oxide gate dielectrics prepared by in-situ rapid thermal N20 oxidation of NH3-nitrided Si", 1999, Symposium on VLSI Technology Digest of Technical Papers, pp. 137-138.

* cited by examiner

*Primary Examiner*—Evan Pert
(74) *Attorney, Agent, or Firm*—Harness, Dickey & Pierce, P.L.C.

(57) ABSTRACT

A method of fabricating a semiconductor device that includes dual spacers is provided. A nitrogen atmosphere may be created and maintained in a reaction chamber by supplying a nitrogen source gas. A silicon source gas and an oxygen source gas may then be supplied to the reaction chamber to deposit a silicon oxide layer on a semiconductor substrate, which may include a conductive material layer. A silicon nitride layer may then be formed on the silicon oxide layer by performing a general CVD process. Next, the silicon nitride layer may be etched until the silicon oxide layer is exposed. Because of the difference in etching selectivity between silicon nitride and silicon oxide, portions of the silicon nitride layer may remain on sidewalls of the conductive material layer. As a result, dual spacers formed of a silicon oxide layer and a silicon nitride layer may be formed on the sidewalls.

19 Claims, 7 Drawing Sheets

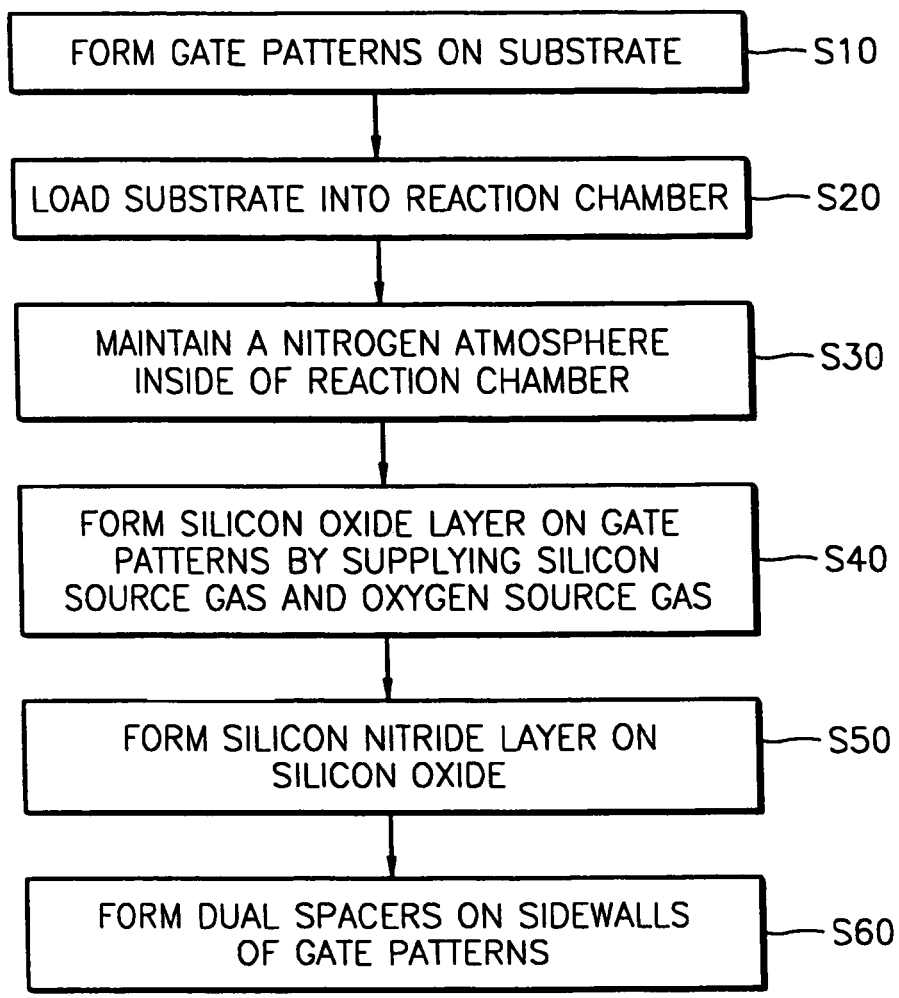
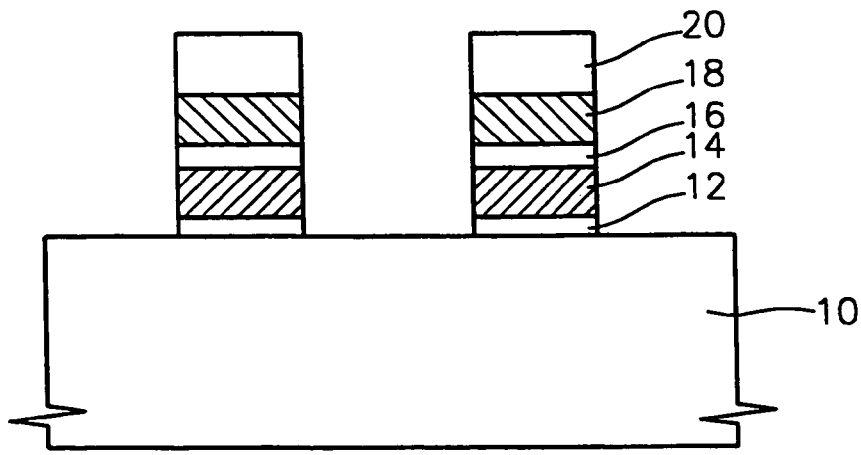

METHOD OF FABRICATING A SEMICONDUCTOR DEVICE HAVING A SILICON OXIDE LAYER, A METHOD OF FABRICATING A SEMICONDUCTOR DEVICE HAVING DUAL SPACERS, A METHOD OF FORMING A SILICON OXIDE LAYER ON A SUBSTRATE, AND A METHOD OF FORMING DUAL SPACERS ON A CONDUCTIVE MATERIAL LAYER

CROSS REFERENCE TO RELATED APPLICATIONS

This application is a continuation of U.S. patent application having Ser. No. 10/612,041 filed Jul. 3, 2003, now U.S. Pat. No. 7,005,367 the entirety of which is hereby incorporated by reference and for which priority is claimed under 35 U.S.C. §120.

BACKGROUND OF THE INVENTION

1. Field of the Invention

Example embodiments of the present invention relate to a method of fabricating a semiconductor device that includes a silicon oxide layer, and more particularly, to a method of fabricating a semiconductor device that includes dual spacers that include a silicon oxide layer formed on sidewalls of a gate line patterns.

2. Description of the Related Art

In semiconductor memory devices, especially in DRAMs having a unit cell with one transistor and one capacitor, a plurality of gate lines serving as conductive lines for transferring signals to gate electrodes of transistors, which form memory cells, may be formed on silicon substrates. These gate lines may form spacers on the sidewalls of gate line patterns to provide insulation between peripheral devices and between direct contacts (DC) and buried contacts (BC) of DRAMs. The spacers may be formed of an insulating material, such as silicon oxide ($SiO_2$) and silicon nitride ($Si_3N_4$). Such insulating materials may improve insulating efficiency and reduce deformation which may occur during subsequent thermal processes.

In conventional methods of forming single spacers on sidewalls of gate line patterns using silicon nitride as a spacer material, a gate insulating layer, a gate conductive layer, and an insulating gate mask layer may be sequentially deposited on a silicon substrate. Gate line patterns may be formed by a photolithography process. Next, a silicon nitride layer may be blanket deposited on the silicon substrate. The gate line patterns and the silicon nitride layer may then be etched until the gate mask layer and the surface of the silicon substrate are exposed. As a result, silicon nitride spacers may be formed on the sidewalls of the gate line patterns.

However, because the difference between the etching selectivity of the silicon nitride layer and the etching selectivity of the silicon substrate is small, the surface of the silicon substrate may be damaged when the silicon nitride layer is etched. In addition, damaged portions of the silicon substrate may cause leakage currents to storage electrodes of capacitors. As a result, refresh characteristics may deteriorate.

For example, when etching a silicon nitride layer to form spacers on the sidewalls of gate line patterns in a RAM device, e.g. a dynamic RAM (DRAM) or a static RAM (SRAM), static refresh varies depending on the thickness of the oxide layer remaining on the silicon substrate. Thus, when the thickness of the remaining oxide layer is small, characteristics of the static refresh may deteriorate because of damage which may occur during a dry etching process.

In addition, when dry etching a silicon nitride layer to form spacers in a RAM device, e.g., SRAM or DRAM, or a logic device, the silicon substrate may be damaged. In addition, fluoric elements which may be included in a dry etching etch gas may combine with the surface of the silicon substrate. As a result, a metal silicide may be formed on an active region of the silicon substrate and defects may occur. Further, when both a metal gate and a salicide process are used, a metal layer of the metal gate may be dissolved by chemical solutions used in a wet cleaning or a metal strip process, e.g., an SC1 or an $H_2SO_4/H_2O_2$ solution, even when the metal gate is encapsulated by a silicon nitride spacer.

In a conventional method of forming dual spacers on gate line patterns, a gate insulating layer, a gate conductive layer, and an insulating gate mask layer may be sequentially deposited on a silicon substrate and gate line patterns may be formed by a photolithography process. A silicon oxide layer and a silicon nitride layer may then be sequentially deposited on the silicon substrate and the gate line patterns. The silicon nitride layer may be etched until the silicon oxide layer is exposed, and a silicon nitride layer may remain on the sidewalls of the gate line patterns. As a result, dual spacers formed of a silicon oxide layer and a silicon nitride layer may be formed on the sidewalls of the gate line patterns.

In such dual spacers, a difference between the etching selectivity of the silicon oxide layer and the etching selectivity of the silicon nitride layer may be large. Therefore, the silicon oxide layer may operate as an etch stopping layer. In addition, the silicon oxide layer may be removed by a subsequent cleaning process and dual spacers may be formed with a reduction in damage to the silicon substrate.

Although a gate line may be formed of a conductive layer which may include a polysilicon layer and a metal silicide layer, a material having a low resistivity may be used as a conductive line to reduce signal delay time. In order to reduce resistance, the metal gate line may include a pure metal layer such as tungsten, molybdenum, titanium, cobalt, nickel, or tantalum instead of the metal silicide layer. A stacked structure of tungsten/tungsten nitride/polysilicon is one example of using a metal layer as a portion of the gate line.

However, when a conventional method of forming dual spacers is applied to a metal gate line, problems with oxidizing the surface of an exposed metal layer, e.g., tungsten, molybdenum, titanium, cobalt, nickel, or tantalum, may occur when depositing a silicon oxide layer after the gate line patterns (including a pure metal layer of tungsten) are formed. The oxidization of the metal layer may cause a reduction of an effective sectional area of a conductive line. As a result, the resistance of the conductive line may increase and the vertical profile of the gate line pattern may deteriorate.

FIG. 1 is a scanning electron microscope (SEM) photograph illustrating a deposition profile of a silicon oxide layer in a semiconductor device fabricated by a conventional method. The gate line patterns in FIG. 1 may be formed by sequentially depositing and patterning a gate oxide layer, a polysilicon layer, a tungsten nitride layer, a tungsten layer, and a silicon nitride layer. The silicon oxide layer may be formed on gate line patterns by simultaneously a silicon source gas (e.g., $SiH_4$) and an oxygen source gas (e.g., $N_2O$). In the example illustrated in FIG. 1, after the silicon oxide layer was formed on the gate line patterns, a polysilicon layer was formed on the entire surface of the substrate having the gate line patterns to a thickness of approximately 2000 Å and the substrate was cut along a vertical direction. The cut substrate was then processed with Hf to selectively etch the silicon oxide layer faster than either the polysilicon layer or the other material layers of the gate line patterns. Black portions along the gate line patterns indicate the silicon oxide layer.

As shown in FIG. 1, when the silicon oxide layer was formed, the tungsten layer may be oxidized and the area of the tungsten layer may be reduced. In addition, oxidized portions of the tungsten layer may protrude from the gate line patterns. Thus, the width of the tungsten layer may be reduced and the vertical profile of the gate line patterns may be of poor quality.

SUMMARY OF THE INVENTION

At least one embodiment of the present invention provides a method of fabricating a semiconductor device that includes a silicon oxide ($SiO_2$) layer. A nitrogen source gas may be supplied to a reaction chamber housing a semiconductor chip to create and maintain a nitrogen atmosphere in the reaction chamber. A silicon source gas and an oxygen source gas may then be added to the reaction chamber to deposit a silicon oxide layer on the substrate. The silicon source gas may be supplied prior to the supply of the oxygen source gas or the silicon source gas and the oxygen gas may be supplied at substantially the same time. In addition, the supply of the nitrogen source gas may be stopped after the supply oxygen source gas, at substantially the same time as the supply of the oxygen source gas, or prior to the supply of the silicon source gas and the oxygen source gas.

A conductive material layer may be formed on the semiconductor substrate, and the silicon oxide layer may be formed on the substrate and the conductive material layer. The conductive material layer may be a gate line pattern, a bitline pattern, an interconnection line pattern, or a conductive pad layer pattern. In addition, the conductive material layer may include a metal layer having an exposed surface. Suitable examples of the exposed metal surface include W, Ni, Co, TaN, Ru—Ta, TiN, Ni—Ti, Ti—Al—N, Zr, Hf, Ti, Ta, Mo, MoN, WN, Ta—Pt, and Ta—Ti.

The nitrogen source gas may be resolved at a low temperature and may not include oxygen. In at least one exemplary embodiment of the present invention, the nitrogen source gas is ammonia ($NH_3$) gas. Suitable examples of the silicon source gas include $SiH_4$ (silane), $Si_2H_6$, dichlorosilane (DCS), trichlorosilane (TCS), and hexachlorodisilane (HCD). Suitable examples of the oxygen source gas include $N_2O$, NO, and $O_2$.

The silicon oxide layer may be deposited by a chemical vapor deposition process at a pressure of from approximately 0.01 to 300 Torr and a temperature of from approximately 500 to 850° C. When the deposition rate is lowered by reducing the flow rate of the process gas, the silicon oxide layer may be deposited by a plasma enhanced CVD (PECVD) method using remote plasma.

At least one exemplary embodiment of the present invention provides a method of forming dual spacers on sidewalls of a conductive material layer. The conductive material layer may be a gate line pattern, a bitline pattern, an interconnection line pattern, or a conductive pad layer pattern. A nitrogen source gas may be supplied to a reaction chamber housing a semiconductor chip to create and maintain a nitrogen atmosphere in the reaction chamber. A silicon source gas and an oxygen source gas may then be added to the reaction chamber to deposit a silicon oxide layer on the substrate. The silicon source gas may be supplied prior to the supply of the oxygen source gas or the silicon source gas and the oxygen gas may be supplied at substantially the same time. In addition, the supply of the nitrogen source gas may be stopped after the initial supply oxygen source gas, at substantially the same time as the supply of the oxygen source gas, or prior to the supply of the silicon source gas and the oxygen source gas.

A silicon nitride layer may be formed on the silicon oxide layer by performing a chemical vapor deposition (CVD) process. Suitable types of CVD processes include plasma enhanced CVD (PE-CVD), high density plasma CVD (HDP-CVD), thermal CVD, laser CVD, and hot filament CVD (HF-CVD). The silicon nitride layer may then be etched until the silicon oxide layer is exposed. Because of the difference in etching selectivity between silicon nitride and silicon oxide, portions of the silicon nitride layer may remain on the sidewalls of the conductive material layer. As a result, dual spacers formed of a silicon oxide layer and a silicon nitride layer may be formed on the sidewalls.

The conductive material layer may include an exposed metal layer such as W, Ni, Co, TaN, Ru—Ta, TiN, Ni—Ti, Ti—Al—N, Zr, Hf, Ti, Ta, Mo, MoN, WN, Ta—Pt, and Ta—Ti. In at least one exemplary embodiment of the present invention, conductive material layer is a gate line pattern, which may be formed of a sequentially stacked structure of a gate insulating layer, a polysilicon layer, a tungsten nitride layer, a tungsten layer, and a gate mask layer.

The nitrogen source gas may be resolved at a low temperature and may not include oxygen. In at least one exemplary embodiment of the present invention, the nitrogen source gas is ammonia ($NH_3$) gas. Suitable examples of the silicon source gas include $SiH_4$ (silane), $Si_2H_6$, dichlorosilane (DCS), trichlorosilane (TCS), and hexachlorodisilane (HCD). Suitable examples of the oxygen source gas include $N_2O$, NO, and $O_2$.

The silicon source gas and the oxygen source gas may be supplied while the reaction chamber is maintained in the nitrogen atmosphere which may reduce the generation of a silicon coating in the reaction chamber. Because the silicon source gas may be supplied to the reaction chamber having a nitrogen atmosphere, the occurrence of a metal silicide layer, which may be formed due to a reaction between the metal layer exposed to the deposition atmosphere and the silicon source gas, may be reduced.

BRIEF DESCRIPTION OF THE DRAWINGS

Exemplary embodiments of the present invention will be readily understood with reference to the following detailed description thereof provided in conjunction with the attached drawings in which:

FIG. 2 is a flowchart depicting steps for fabricating a semiconductor device that includes a silicon oxide layer according to at least one exemplary embodiment of the present invention;

FIGS. 3 through 6 are cross-sectional views illustrating a method of fabricating a semiconductor device that includes a silicon oxide layer according to at least one exemplary embodiment of the present invention;

DETAILED DESCRIPTION OF EXEMPLARY EMBODIMENTS

Figure 1:
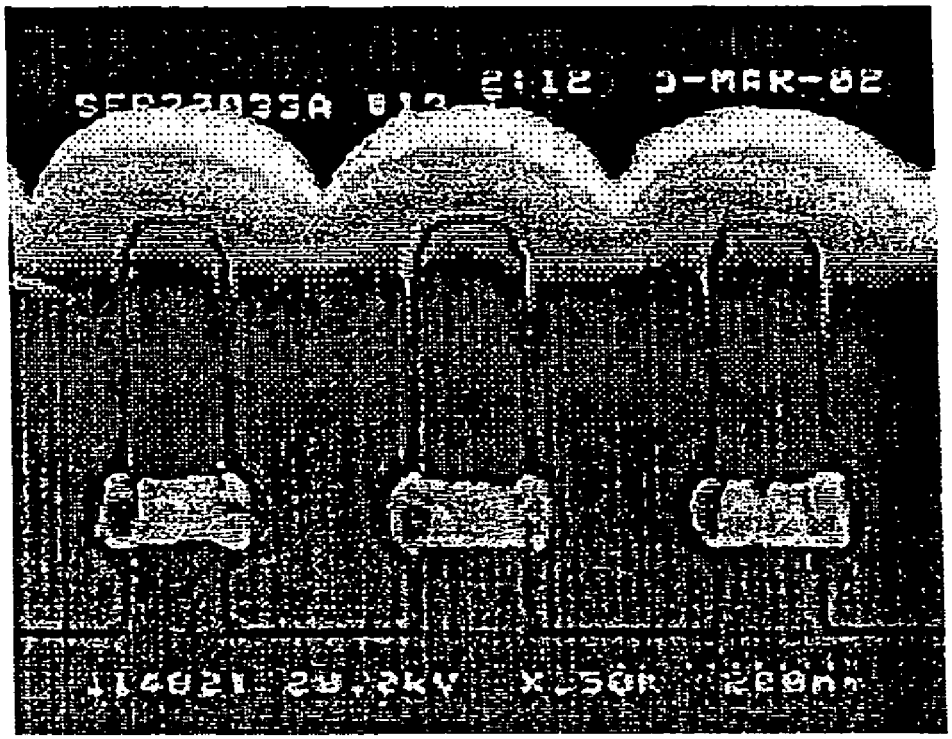
FIG. 1 is a scanning electron microscope (SEM) photograph illustrating a deposition profile of a silicon oxide layer ($SiO_2$) in a semiconductor device fabricated by a conventional method.

Exemplary embodiments of the present invention will now be described more fully with reference to the accompanying drawings, in which exemplary embodiments of the invention are shown. This invention may, however, be embodied in many different forms and should not be construed as being limited to the exemplary embodiments set forth herein. Rather, these exemplary embodiments are provided so that this disclosure will be thorough and complete and will fully convey the concept of the invention to those skilled in the art. In the drawings, the thickness of layers and regions may be exaggerated for clarity. The same reference numerals in different drawings represent the same elements.

A method of fabricating dual spacers on sidewalls of metal gate line patterns according to an exemplary embodiment of the present invention will now be described with reference to FIGS. 2 through 6.

FIG. 2 is a flowchart depicting steps for a method of fabricating a semiconductor device that includes a silicon oxide layer according to an exemplary embodiment of the present invention. FIGS. 3 through 6 are cross-sectional views illustrating a method of fabricating a semiconductor device according to at least one exemplary embodiment of the present invention.

Referring to FIG. 3, in step S10, gate patterns may be formed on a substrate. A gate oxide layer (e.g., a gate insulating layer) 12, a polysilicon layer (e.g., a first conductive layer) 14, a tungsten nitride layer (e.g., a second conductive layer) 16, a tungsten layer (e.g., a third conductive layer) 18, and an insulating silicon nitride layer (e.g., a gate mask layer) 20 may be deposited, e.g., sequentially, on a silicon substrate 10. Gate line patterns may then be formed by a photolithography process. Oxide layers may be formed on the sides of the polysilicon layer of the gate line patterns by oxidizing the polysilicon layer.

Although gate line patterns having a structure of a polysilicon layer, a tungsten nitride layer, a tungsten layer, and a gate mask layer are depicted and described herein, exemplary embodiments of the present invention may be used to form an oxide layer on a conductive material layer of a substrate or on an exposed metal layer, including a pure metal layer having a low resistance. For example, a silicon oxide layer may be formed on bitline patterns, interconnection patterns, and/or conductive pad patterns. Suitable examples of the exposed metal layer include, but are not limited to, W, Ni, Co, TaN, Ru—Ta, TiN, Ni—Ti, Ti—Al—N, Zr, Hf, Ti, Ta, Mo, MoN, WN, Ta—Pt, and Ta—Ti. In addition, the materials and the thickness of the layers and the processes may be varied depending on the experimental conditions, such as the type of the reaction chamber and the process gases that are used. Further, the thickness of the metal layer may vary according to the metal and materials used. For example, the thickness of the metal layer may be from approximately 100 to approximately 2,000 Å.

In step S20, the substrate 10, including the gate line patterns, may be loaded into a reaction chamber in which a deposition process, e.g., a chemical vapor deposition (CVD) process, may be performed. Suitable types of CVD processes include plasma enhanced CVD (PE-CVD), high density plasma CVD (HDP-CVD), thermal CVD, laser CVD, and hot filament CVD (HF-CVD). Exemplary embodiments of the present invention may be applied to deposition processes with plasma by reducing the flow rates of the process gases or by reducing the deposition speed using a remote plasma source.

In exemplary embodiments of the present embodiment, a single wafer type reaction chamber or a batch type reaction chamber may be used as the reaction chamber. Experimental conditions may vary depending on the equipment used, and these experimental conditions would be easily determined by one of skill in the art. Although a CVD process in a single wafer type reaction chamber is described herein, a furnace having a large capacity and the ability to control the pressure, temperature, and flow rates of gases entering into the furnace may alternatively be used.

A nitrogen atmosphere may be created and maintained in the reaction chamber in step S30. In order to maintain a nitrogen atmosphere inside the reaction chamber, a nitrogen source gas, e.g., a gas that includes nitrogen, may be supplied to the reaction chamber, e.g., at a constant flow rate, for a period of time. The nitrogen atmosphere gas may be resolved at a low temperature and may not include oxygen. The absence of oxygen may reduce the oxidation of the metal layer. In at least one exemplary embodiment of the present invention, ammonia ($NH_3$) gas is used as the nitrogen source gas. Other suitable nitrogen source gases would be easily identified by those of skill in the art. When the nitrogen source gas is supplied prior to the supply of the silicon source gas and the oxygen source gas, metal oxides may be removed from the surface of the metal layer which may increase a process margin, may reduce the generation of a silicon coating in the reaction chamber, and may reduce the generation of particles in the reaction chamber.

Figure 4:
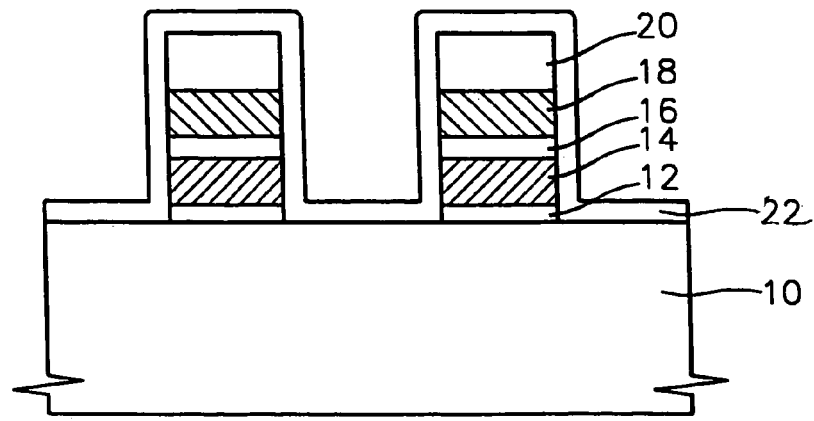

In step S40, a silicon source gas and/or an oxygen source gas may be supplied to the reaction chamber in the nitrogen atmosphere to form a silicon oxide layer 22 on the gate line patterns (see FIG. 4). Suitable examples of the silicon source gas include, but are not limited to, $SiH_4$, $Si_2H_6$, dichlorosilane (DSC), trichlorosilane (TCS), and hexachlorodisilane (HCD). Suitable examples of the oxygen source gas include, but are not limited to, $N_2O$, NO, and $O_2$. Because the silicon source gas may be supplied to the reaction chamber having a nitrogen atmosphere, the occurrence of a metal silicide layer, which may be formed due to a reaction between the metal layer exposed to the deposition atmosphere and the silicon source gas, may be reduced.

In addition, a metal oxide layer, which may be formed on the surface of the metal layer during a re-oxidation of the polysilicon layer or during an ashing process for removing a photoresist layer used as an ion implantation mask, may be removed by the nitrogen source gas. Furthermore, since oxidation of the metal layer may be reduced by methods according to exemplary embodiments of the present invention, the resistance of the metal layer may not be increased and the vertical profile of the gate line patterns may be maintained.

Figure 5:
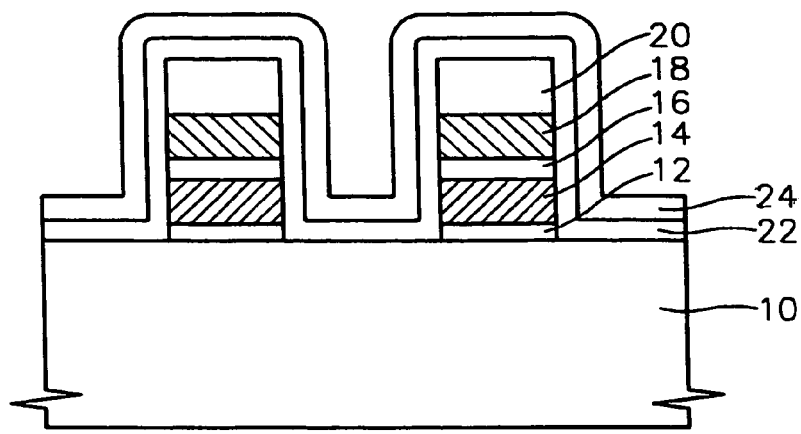

As depicted in FIG. 5, in step S50, a silicon nitride layer 24 may be formed on the silicon oxide layer 22 by performing a general CVD process. As described above, suitable types of CVD processes include plasma enhanced CVD (PE-CVD), high density plasma CVD (HDP-CVD), thermal CVD, laser CVD, and hot filament CVD (HF-CVD).

Figure 6:
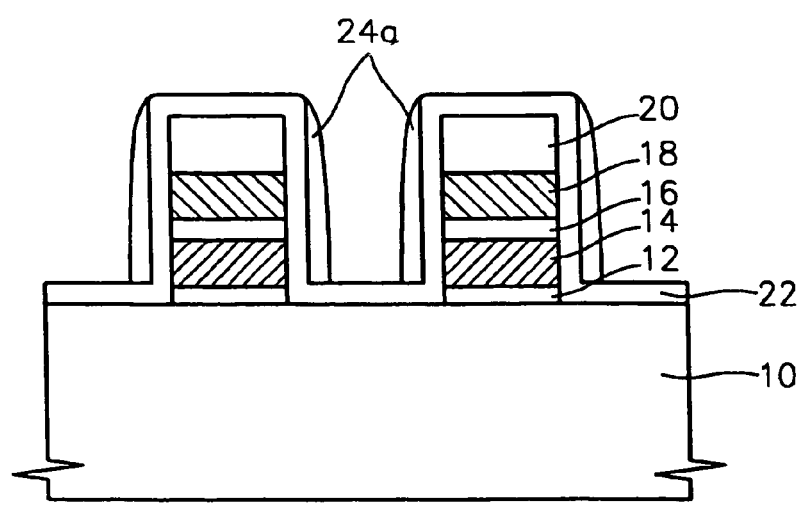

Next, as shown in FIG. 6, the silicon nitride layer 24 may be blanket etched until the silicon oxide layer 22 is exposed. Because a difference of the etching selectivity between silicon nitride and silicon oxide is large, silicon nitride spacers 24a may remain on the sidewalls of the gate line patterns. The silicon oxide layer 22 that may remain between the gate line patterns may be removed by an etching process, such as, for example, wet etching. As a result, dual spacers 24a formed of the silicon oxide layer 22 and the silicon nitride layer 24 may be formed on the sidewalls of the gate line patterns.

Hereafter, a process of maintaining a nitrogen atmosphere inside a reaction chamber and a process of forming a silicon oxide layer on gate patterns by supplying a silicon source gas and an oxygen source gas to the reaction chamber, which are steps S30 and S40 illustrated in FIG. 2, respectively, will now be described.

FIGS. 7A through 9B are graphs illustrating various times when the process gases, e.g., the nitrogen source gas, the silicon source gas, and the oxygen source gas, may be supplied to the reaction chamber according to exemplary embodiments of the present invention. In FIGS. 7A through 9B, the x-axis represents time and the y-axis represents the process gas. For example, process gas A represents the nitrogen source gas (e.g., $NH_3$ gas), process gas B represents the silicon source gas (e.g., silane gas), and process gas C represents the oxygen source gas (e.g., $O_2$ gas). Solid lines represent the beginning of the supply of the process gas to the reaction chamber, the duration of the supply of the process gas, and the end of the supply of process gas.

Figure 7A:
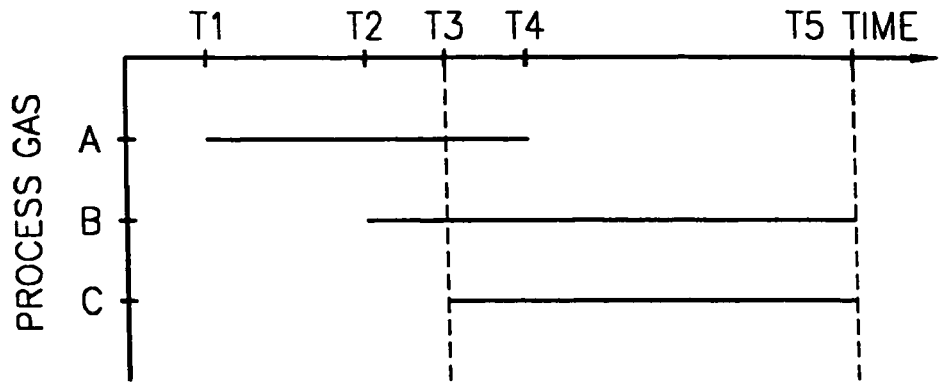
FIGS. 7A through 9B are graphs illustrating various times when process gases may be supplied to a reaction chamber in methods according to exemplary embodiments of the present invention.

For example, in FIG. 7A, T1 represents the time of the initial supply of the nitrogen source gas to the reaction chamber, T2 represents the time of the initial supply of the silicon source gas to the reaction chamber, T3 represents the time of the initial supply of the oxygen source gas in the reaction chamber, T4 represents the time when the supply of the nitrogen source gas is stopped, and T5 represent the time when the supply of the silicon source gas and the oxygen source gas is stopped. In exemplary embodiments of the present invention, the silicon oxide layer 22 may be deposited on the gate line patterns at T3, which is the time when the oxygen source gas may be first supplied to the reaction chamber, and the deposition of the silicon oxide layer 22 may be stopped at T5, which is the time when the supply of the oxygen source gas may be stopped.

Figure 7B:
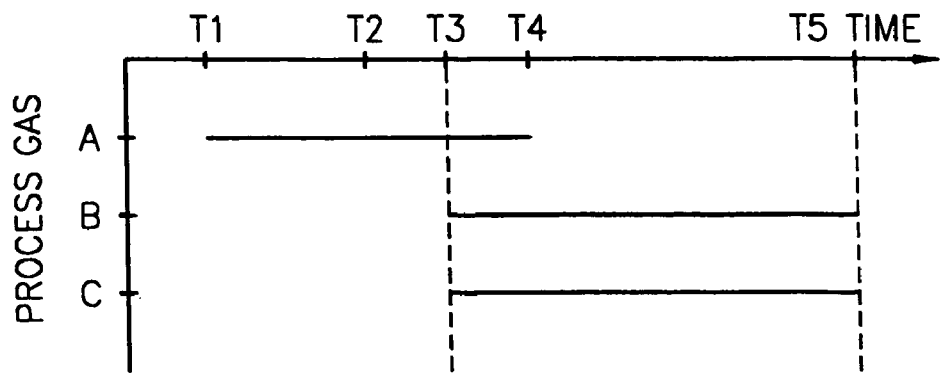
Figure 8A:
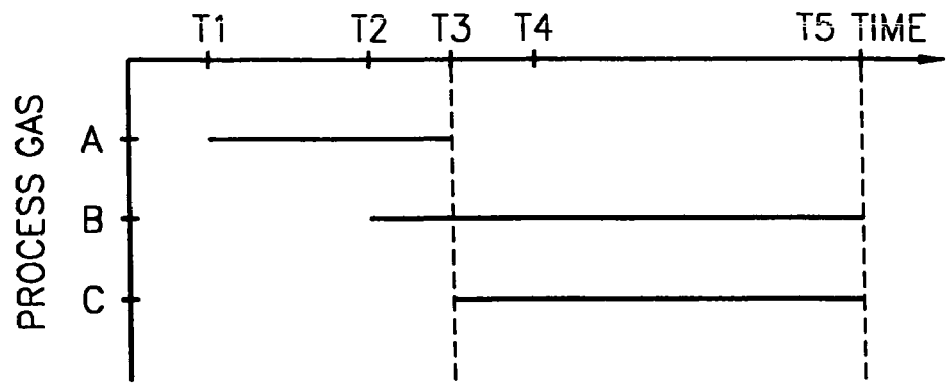
Figure 8B:
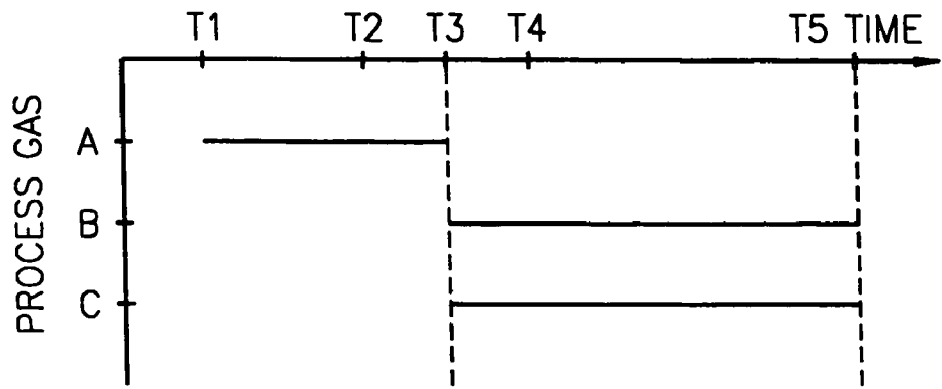
Figure 9A:
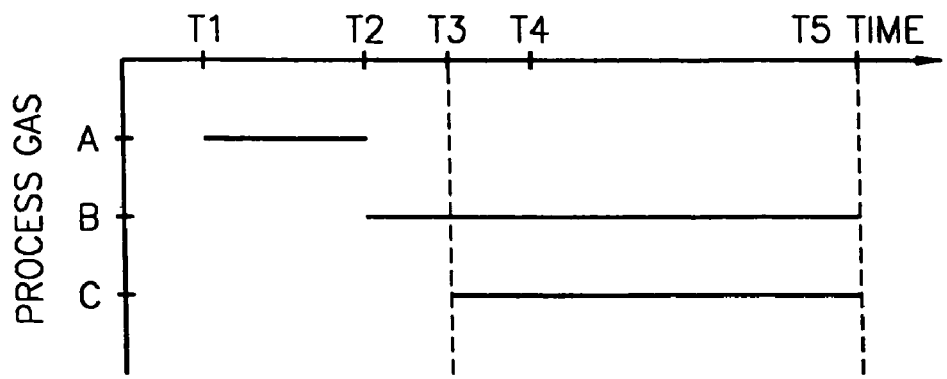
Figure 9B:
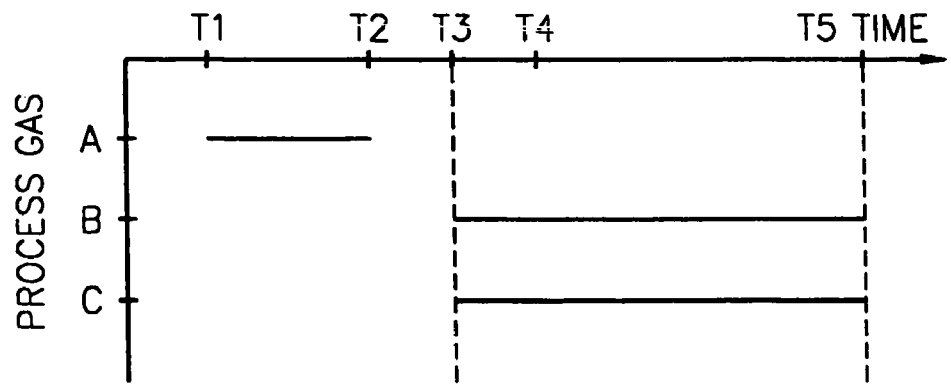

In FIGS. 7A and 7B, the nitrogen source gas may be supplied to the reaction chamber to maintain a nitrogen atmosphere inside the reaction chamber and the supply of the nitrogen source gas may be stopped when the oxygen source gas is supplied to the reaction chamber. In FIGS. 8A and 8B, the supply of the nitrogen source gas may be stopped at substantially the same time as the initial supply of the oxygen source gas. In FIGS. 9A and 9B, the supply of the nitrogen source gas may be stopped before the oxygen source gas is supplied to the reaction chamber. In addition, in FIGS. 7A, 8A, and 9A, the silicon source gas may be supplied to the reaction chamber prior to the supply of the oxygen source gas. In FIGS. 7B, 8B, and 9B, the silicon source gas and the oxygen source gas may be supplied at substantially the same time. Other orders for the supply of gases to the reaction chamber may be easily determined by one of skill in the art.

When the silicon source gas is supplied to the reaction chamber having a nitrogen atmosphere, a thin silicon nitride layer may be deposited on the gate line patterns. However, because the flow rate and the supply period of the nitrogen source gas may be small, the deposition or the thickness of the silicon nitride layer may be controlled so that the silicon nitride layer does not operate as a barrier. In addition, when the supply of the nitrogen source gas is stopped before the oxygen source gas is supplied to the reaction chamber as illustrated in FIGS. 9A and 9B, the interval between the end of the supply of the nitrogen source gas and the beginning of the supply of the oxygen source gas may be reduced in order to supply the silicon source gas and the oxygen source gas to the reaction chamber under a nitrogen atmosphere.

Experimental conditions and parameters in methods according to exemplary embodiments of the present invention may vary according to the type and size of the reaction chamber, and the types and pressures of the process gases. For example, when the reaction chamber is a single wafer type reaction chamber, the temperature may range from approximately 500 to approximately 850° C., the pressure may range from approximately 100 to approximately 300 Torr, the flow rate of the nitrogen source gas may range from approximately 50 to approximately 500 sccm, the flow rate of the silicon source gas may range from approximately 1 to approximately 10 sccm, and the flow rate of the oxygen source gas may range from approximately 500 to approximately 5,000 sccm. In another exemplary embodiment of the present invention, the temperature may range from approximately 500 to approximately 850° C., the pressure may range from approximately 0.1 to approximately 3 Torr, the flow rate of the nitrogen source gas may range from approximately 50 to approximately 1,000 sccm, the flow rate of the silicon source gas may range from approximately 1 to approximately 50 sccm, and the flow rate of the oxygen source gas may range from approximately 50 to approximately 1,000 sccm.

When the reaction chamber is a batch type reaction chamber, the temperature may range from approximately 500 to approximately 850° C., the pressure may range from approximately 0.1 to approximately 2 Torr, the flow rate of the nitrogen source gas may range from approximately 50 to approximately 1,000 sccm, the flow rate of the silicon source gas may range from approximately 5 to approximately 200 sccm, and the flow rate of the oxygen source gas may range from approximately 50 to approximately 1,000 sccm.

Figure 10:
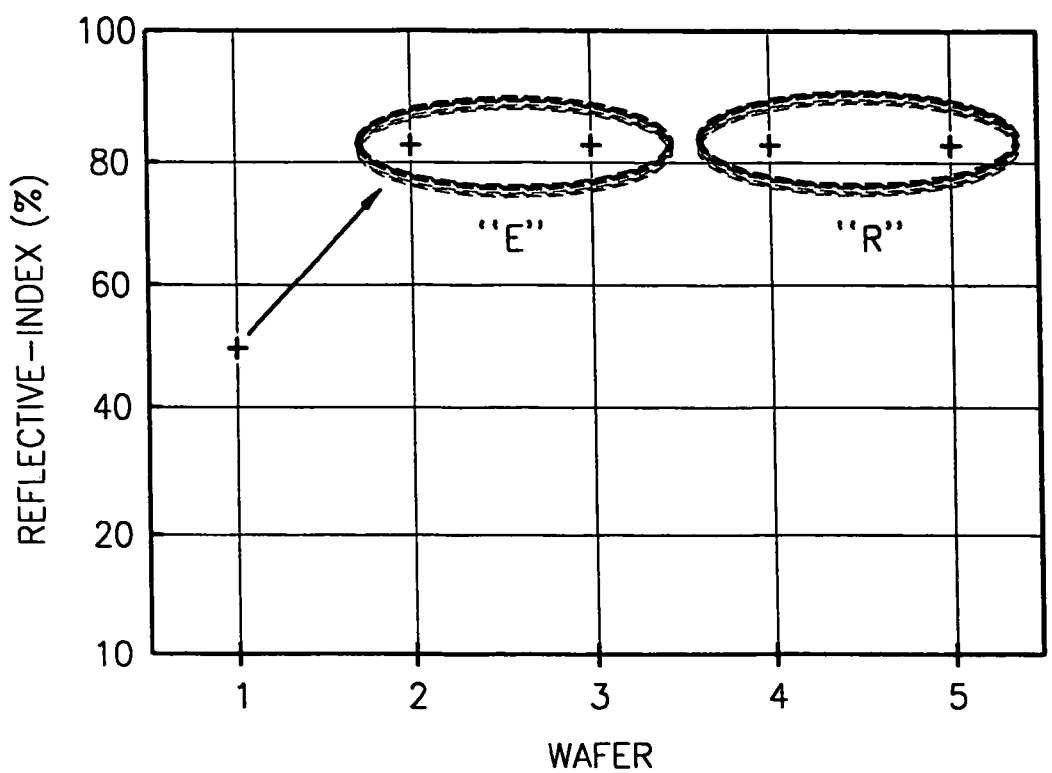
FIG. 10 is a graph depicting reflective indexes of wafers which may be used to determine the removal efficiency of metal oxides formed in methods according to exemplary embodiments of the present invention.

FIG. 10 is a graph depicting reflective indexes of five wafers which are the result of experiments conducted to determine the removal efficiency of metal oxides formed in exemplary embodiments of the present invention. The x-axis denotes the wafer number and the y-axis denotes the reflective index.

Wafer 1, which includes a tungsten oxide layer formed on a tungsten layer, may be formed by depositing a tungsten nitride layer and a tungsten layer on a silicon substrate and performing an ashing process. As shown in FIG. 10, wafer 1 has a reflective index of approximately 50%. Wafers 2 and 3, which have a reflective index of approximately 85%, may be formed by depositing a tungsten nitride layer and a tungsten layer on a silicon substrate, and performing an ashing process to form a tungsten oxide layer as in wafer 1, and processing the silicon substrate having the tungsten layer in a reaction chamber with a nitrogen atmosphere as an exemplary embodiment of the present invention. Reference wafers 4 and 5, which have a tungsten nitride layer and a tungsten layer, have a reflective index of approximately 85%. Because wafers 2 and 3 have approximately the same reflective index, as the reference wafers 4 and 5, e.g., approximately 85%, it may be concluded that the tungsten oxide layer was removed from the tungsten layer in wafers 2 and 3.

Figure 11:
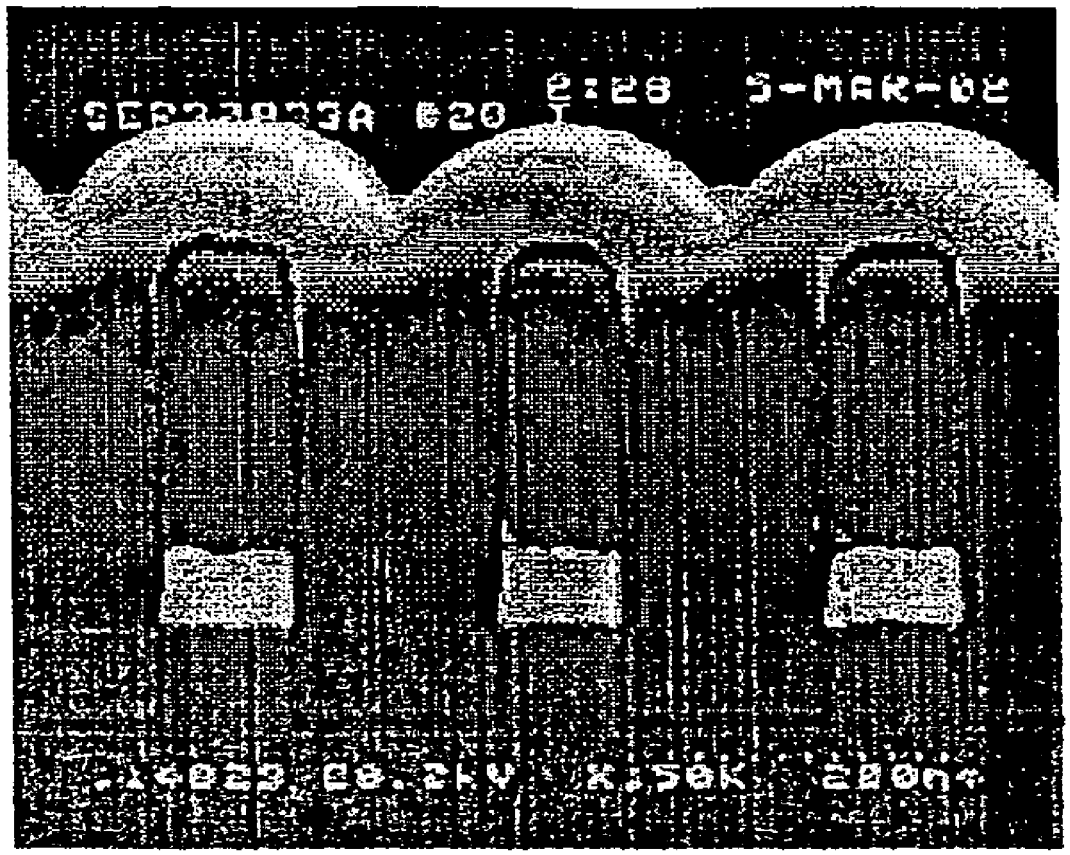
FIG. 11 is a scanning electron microscope (SEM) photograph illustrating a deposition profile of a silicon oxide layer in a semiconductor device fabricated by a method according to at least one embodiment of the present invention.

FIG. 11 is a scanning electron microscope (SEM) photograph showing the deposition profile of a silicon oxide layer in a semiconductor device fabricated by a method according to an exemplary embodiment of the present invention. The gate line pattern was formed by sequentially depositing and patterning a gate oxide layer, a polysilicon layer, a tungsten nitride layer, a tungsten layer, and a silicon nitride layer. A silicon oxide layer was formed on the gate line patterns by supplying $NH_3$ gas as the nitrogen source gas to the reaction chamber for approximately 5 seconds. Next, $N_2O$ gas, e.g., the oxygen source gas, was supplied to the reaction chamber. The supply of the $NH_3$ gas was stopped at substantially the same time that the N₂O gas was supplied to the reaction chamber. Silane gas (SiH₄) was used as the silicon source gas and was supplied to the reaction chamber approximately two seconds before the initial supply of the N₂O gas. The polysilicon layer was formed to a thickness of approximately 2,000 Å on the entire surface of the substrate.

The substrate was then cut along a vertical direction and was processed with Hf to selectively etch the silicon oxide layer faster than the polysilicon layer or the other material layers of the gate line patterns. Black portions along the gate line pattern of FIG. 11 represent the silicon oxide layers. As shown in FIG. 11, when the silicon oxide layer was formed, the tungsten layer may not be oxidized and, as a result, the area of the tungsten layer may not be reduced. In addition, the oxidized portions of the tungsten layer may not protrude from the gate line patterns. Thus, the width of the tungsten layer may not be reduced and the vertical profile of the gate line patterns may be improved.

While the invention has been particularly shown and described with reference to exemplary embodiments thereof, it should be understood by those skilled in the art that various changes in form and details may be made therein without departing from the spirit and scope of the invention as defined by the appended claims.

What is claimed is:

1. A method of fabricating a semiconductor device, the method comprising:
   providing a semiconductor substrate;
   forming a gate insulating layer on the semiconductor substrate;
   forming a gate electrode layer on the gate insulating layer;
   supplying a nitrogen source gas to a reaction chamber to create a nitrogen atmosphere in the reaction chamber; and
   supplying a silicon source gas and an oxygen source gas to the nitrogen atmosphere in the reaction chamber to deposit a silicon oxide layer on the semiconductor substrate of the semiconductor device.

2. The method of claim 1, wherein the nitrogen source gas is NH₃ gas.

3. The method of claim 2, wherein the silicon source gas is supplied prior to supplying the oxygen source gas.

4. The method of claim 2, wherein the silicon source gas and the oxygen source gas are supplied at substantially the same time.

5. The method of claim 2, wherein the supply of the nitrogen source gas is stopped after the supply of the oxygen source gas begins.

6. The method of claim 2, wherein the supply of the nitrogen source gas is stopped at substantially the same time as the supply of the oxygen source gas is initiated.

7. The method of claim 2, wherein the supply of the nitrogen source gas is stopped prior to supplying the silicon source gas and the oxygen source gas.

8. The method of claim 1, further comprising:
   forming a silicon nitride layer on the silicon oxide layer; and
   etching the silicon nitride layer and the silicon oxide layer to form dual spacers on sidewalls of the gate electrode.

9. A method of fabricating a semiconductor device, the method comprising:
   providing a semiconductor substrate;
   forming a gate insulating layer on the semiconductor substrate;
   forming a gate electrode layer including poly silicon and metal on the gate insulating layer;
   supplying a nitrogen source gas to a reaction chamber to create a nitrogen atmosphere in the reaction chamber; and
   supplying a silicon source gas and an oxygen source gas to the nitrogen atmosphere in the reaction chamber to deposit a silicon oxide layer on the semiconductor substrate of the semiconductor device.

10. The method of claim 9, wherein the nitrogen source gas is NH₃ gas.

11. The method of claim 10, wherein the silicon source gas is supplied prior to supplying the oxygen source gas.

12. The method of claim 10, wherein the silicon source gas and the oxygen source gas are supplied at substantially the same time.

13. The method of claim 10, wherein the supply of the nitrogen source gas is stopped after the supply of the oxygen source gas begins.

14. The method of claim 10, wherein the supply of the nitrogen source gas is stopped at substantially the same time as the supply of the oxygen source gas is initiated.

15. The method of claim 10, wherein the supply of the nitrogen source gas is stopped prior to supplying the silicon source gas and the oxygen source gas.

16. The method of claim 9, further comprising:
   forming a silicon nitride layer on the silicon oxide layer; and
   etching the silicon nitride layer and the silicon oxide layer to form dual spacers on sidewalls of the gate electrode.

17. The method of claim 9, wherein the metal is metal nitride.

18. The method of claim 9, the gate electrode layer further including metal nitride.

19. The method of claim 9, wherein the gate electrode layer includes the poly silicon, a metal nitride, the metal and a capping nitride in order.

* * * * *